US012660725B2

(12) United States Patent
Moriyama et al.

(10) Patent No.: US 12,660,725 B2
(45) Date of Patent: Jun. 16, 2026

(54) SEMICONDUCTOR DEVICE AND METHOD OF MANUFACTURING THE SAME

(71) Applicant: Sumitomo Electric Industries, Ltd., Osaka (JP)

(72) Inventors: Yutaka Moriyama, Osaka (JP); Tatsuya Hashinaga, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 469 days.

(21) Appl. No.: 18/106,541

(22) Filed: Feb. 7, 2023

(65) Prior Publication Data

US 2023/0290752 A1    Sep. 14, 2023

(30) Foreign Application Priority Data

Mar. 14, 2022    (JP) .................................. 2022-038784

(51) Int. Cl.
| | |
|---|---|
| *H01L 23/00* | (2006.01) |
| *H10W 90/00* | (2026.01) |
| *H10W 72/00* | (2026.01) |

(52) U.S. Cl.
CPC ........ *H10W 90/811* (2026.01); *H10W 72/884* (2026.01); *H10W 90/756* (2026.01)

(58) Field of Classification Search
CPC ..... H01L 23/5389; H01L 24/45; H01L 24/85; H10W 90/811; H10W 72/884; H10W 90/756
See application file for complete search history.

(56) References Cited

U.S. PATENT DOCUMENTS

| | | | |
|---|---|---|---|
| 2008/0157402 A1* | 7/2008 | Ramakrishna ...... | H01L 21/6835 |
| | | | 257/787 |
| 2012/0193805 A1* | 8/2012 | Ramakrishna ........ | H01L 25/165 |
| | | | 257/773 |
| 2019/0115287 A1* | 4/2019 | Derai ...................... | H01L 24/73 |
| 2020/0053883 A1 | 2/2020 | Inque | |

FOREIGN PATENT DOCUMENTS

JP          2019-176149 A     10/2019

* cited by examiner

*Primary Examiner* — Walter H Swanson
(74) *Attorney, Agent, or Firm* — Volpe Koenig

(57) ABSTRACT

A semiconductor device includes a metal plate having a base portion and a terminal portion separated from the base portion, a resin layer provided between the base portion and the terminal portion and so as to surround the metal plate in a planar direction, and at which an upper and a lower surface of each of the base portion and the terminal portion are exposed, a semiconductor chip mounted on the base portion, a first electrically insulating layer provided on the metal plate and the resin layer so as to cover the semiconductor chip, and one or more wires provided on the first electrically insulating layer and including at least one wire configured to electrically connect the semiconductor chip and the terminal portion to each other.

12 Claims, 17 Drawing Sheets

SEMICONDUCTOR DEVICE AND METHOD OF MANUFACTURING THE SAME

CROSS-REFERENCE TO RELATED APPLICATION

This application claims priority based on Japanese Patent Application No. 2022-038784, filed on Mar. 14, 2022, and the entire contents of the Japanese patent application are incorporated herein by reference.

FIELD OF THE INVENTION

The present invention relates to a semiconductor device and a method of manufacturing the same, for example, a semiconductor device including a semiconductor chip and a method of manufacturing the same.

BACKGROUND ART

There is known a semiconductor device in which a semiconductor chip is mounted face-up on a metal base in a package including the metal base and an insulating frame provided on the metal base, and the semiconductor chip is electrically connected to a pattern on the insulating frame using a bonding wire (for example, PTL 1: Japanese Patent Application Laid-Open No. 2019-176149).

SUMMARY OF THE INVENTION

A semiconductor device according to an embodiment of the present disclosure includes a metal plate having a base portion and a terminal portion separated from the base portion; a resin layer provided between the base portion and the terminal portion and so as to surround the metal plate in a planar direction, and at which an upper surface and a lower surface of each of the base portion and the terminal portion are exposed; a semiconductor chip mounted on the base portion; a first electrically insulating layer provided on the metal plate and the resin layer so as to cover the semiconductor chip; and one or more wires provided on the first electrically insulating layer and including at least one wire configured to electrically connect the semiconductor chip and the terminal portion to each other.

A method of manufacturing a semiconductor device according to another embodiment of the present disclosure includes forming a resin layer among a base portion, a terminal portion, and a connection portion at a lead frame that includes a plurality of regions each having the base portion and the terminal portion separated from each other in each region and the connection portion configured to connect the base portion and the terminal portion in one of adjacent regions of the plurality of regions with the base portion and the terminal portion in another one of the adjacent regions; mounting a semiconductor chip on each base portion in the plurality of regions; forming an electrically insulating layer on the lead frame and the resin layer so as to cover the semiconductor chip; forming, on the electrically insulating layer, a wire configured to electrically connect the semiconductor chip and the terminal portion to each other; and forming, after forming the wire, a plurality of the semiconductor devices corresponding to the plurality of regions by cutting the connection portion and the resin layer between the adjacent regions.

DESCRIPTION OF EMBODIMENTS

Figure 1:
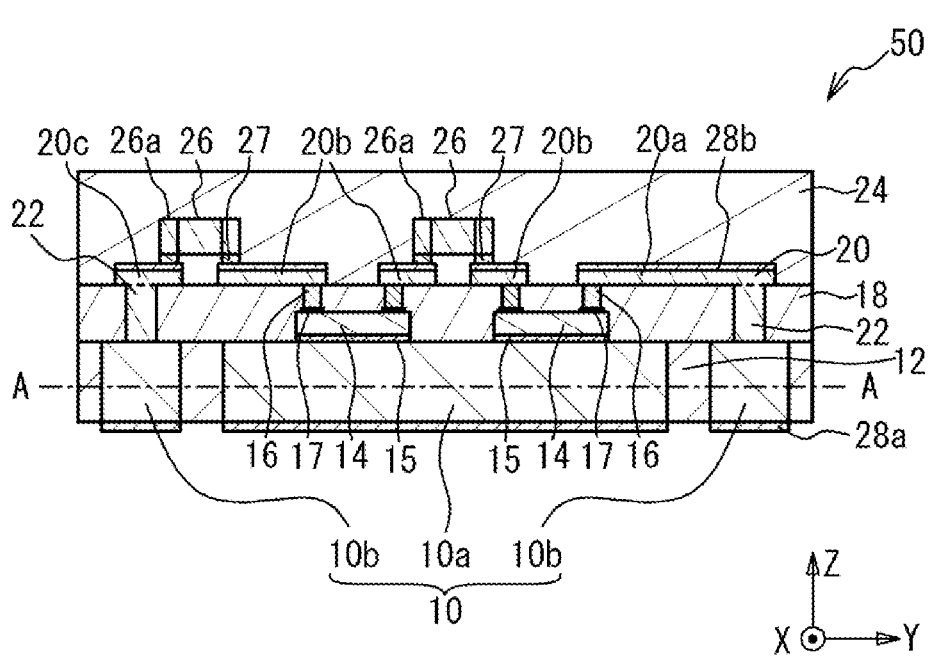
FIG. 1 is a cross-sectional view of a semiconductor device according to a first embodiment.

In the mounting method of PTL 1, heat from a semiconductor chip is dissipated through a metal base, resulting in high heat dissipation. However, since the semiconductor chip is mounted on each package, the cost increases.

The present disclosure has been made in view of the above problem, and an object of the present disclosure is to provide a semiconductor device and a method of manufacturing the semiconductor device that can be manufactured at a low cost.

First, the contents of embodiments according to the present disclosure will be listed and described.

(1) A semiconductor device according to an embodiment of the present disclosure includes a metal plate having a base portion and a terminal portion separated from the base portion; a resin layer provided between the base portion and the terminal portion and so as to surround the metal plate in a planar direction, and at which an upper surface and a lower surface of each of the base portion and the terminal portion are exposed; a semiconductor chip mounted on the base portion; a first electrically insulating layer provided on the metal plate and the resin layer so as to cover the semiconductor chip; and one or more wires provided on the first electrically insulating layer and including at least one wire configured to electrically connect the semiconductor chip and the terminal portion to each other. This makes it possible to provide a semiconductor device capable of reducing the cost.

(2) The metal plate may include a first connection portion connected to the base portion, and a second connection portion connected to the terminal portion. The base portion and the terminal portion may not be exposed from a side surface of the resin layer, and a side surface of each of the first connection portion and the second connection portion may be exposed from a side surface of the resin layer.

(3) The semiconductor device may further includes an electronic component mounted on the first electrically insulating layer and connected to at least one of the one or more wires.

(4) The metal plate may be thicker than the first electrically insulating layer.

(5) The semiconductor device may further include a metal pillar that is provided at an upper surface of the semiconductor chip, extends through the first electrically insulating layer, and is configured to connect the semiconductor chip and at least one of the one or more wires to each other.

(6) The terminal portion and at least one of the one or more wires may be connected to each other through a through hole extending through the first electrically insulating layer.

(7) The semiconductor device may further include a second electrically insulating layer provided on the first electrically insulating layer so as to cover the one or more wires.

(8) A method of manufacturing a semiconductor device according to another embodiment of the present disclosure includes forming a resin layer among a base portion, a terminal portion, and a connection portion at a lead frame that includes a plurality of regions each having the base portion and the terminal portion separated from each other in each region and the connection portion configured to connect the base portion and the terminal portion in one of adjacent regions of the plurality of regions with the base portion and the terminal portion in another one of the adjacent regions; mounting a semiconductor chip on each base portion in the plurality of regions; forming an electrically insulating layer on the lead frame and the resin layer so as to cover the semiconductor chip; forming, on the electrically insulating layer, a wire configured to electrically connect the semiconductor chip and the terminal portion to each other; and forming, after forming the wire, a plurality of the semiconductor devices corresponding to the plurality of regions by cutting the connection portion and the resin layer between the adjacent regions. This makes it possible to provide a method of manufacturing a semiconductor device capable of reducing the cost.

[Details of Embodiments of the Present Disclosure]

Specific examples of a semiconductor device and a manufacturing method thereof according to an embodiment of the present disclosure will be described below with reference to the drawings. The present disclosure is not limited to these examples, and is defined by the scope of the claims, and is intended to include all modifications within the meaning and scope equivalent to the scope of the claims.

First Embodiment

A first embodiment is an example in which a nitride semiconductor chip such as a gallium nitride high electron mobility transistor (GaN HEMT) is mounted by a fan-out panel level package (FO-PLP) using a chip first process method. The FO-PLP is a method of manufacturing multiple semiconductor devices by manufacturing a package on a rectangular substrate having a width of 500 mm to 700 mm and then cutting the rectangular substrate into individual chips. The chip first process method is a method in which a semiconductor chip is mounted on a rectangular substrate and then a rewiring layer is formed.

FIG. 1 is a cross-sectional view of a semiconductor device according to the first embodiment. As illustrated in FIG. 1, in a semiconductor device 50, a metal plate 10 includes a base portion 10a and terminal portions 10b which are separated from each other. Metal plate 10 is made of, for example, a copper-based material and contains copper as a main component. Since base portion 10a functions as a heat sink, metal plate 10 has a thickness of, for example, 0.5 mm or more, and, for example, 1 mm or more. A resin layer 12 is provided between base portion 10a and terminal portion 10b and so as to surround metal plate 10 in a planar direction. Resin layer 12 is, for example, an epoxy resin. Resin layer 12 has a substantially the same thickness as metal plate 10, for example, and a lower surface and an upper surface of metal plate 10 are exposed from resin layer 12. A metal film 28a is provided on the lower surface of metal plate 10. Metal film 28a is, for example, a gold film, and is a film for improving solder wettability.

Each of semiconductor chips 14 is bonded onto base portion 10a with a bonding material 15 interposed therebetween. Bonding material 15 is, for example, a metal layer obtained by sintering a metal paste such as a silver paste. As an example, bonding material 15 is a metal layer obtained by sintering a nano silver paste having good heat dissipation. In semiconductor chip 14, for example, a GaN HEMT is provided, and, for example, a GaN-based semiconductor layer is mainly provided on a SiC substrate. Semiconductor chip 14 may be an integrated circuit such as a monolithic microwave integrated circuit (MMIC). Semiconductor chip 14 has a thickness of, for example, 50 μm to 200 μm. Each of metal pillars 16 is provided on semiconductor chip 14. Metal pillars 16 are, for example, copper pillars, and are bonded onto electrodes 17 provided on semiconductor chip 14 by a bonding material, respectively. The bonding material is, for example, a metal layer obtained by sintering, for example, a copper paste or a gold-tin paste, or a brazing material such as a solder. Metal pillar 16 may be formed on electrode 17 by a plating method or the like. Metal pillar 16 has a height of 50 μm to 200 μm and a width of 50 μm to 200 μm, for example. A passive chip may be provided on base portion 10*a* in addition to semiconductor chip 14.

An electrically insulating layer 18 is provided on metal plate 10 and resin layer 12 so as to cover semiconductor chip 14. Electrically insulating layer 18 is, for example, a resin layer such as an epoxy resin. The thickness of electrically insulating layer 18 is smaller than that of metal plate 10, and is, for example, 100 μm to 500 μm. The upper surface of metal pillar 16 is exposed from electrically insulating layer 18. A plurality of through electrodes 22 are provided which extend through electrically insulating layer 18 and connect to terminal portions 10*b*. Wires 20 are provided on electrically insulating layer 18. Wire 20 is a rewiring layer, and is, for example, a metal layer such as a copper layer or a gold layer. The term "rewiring layer" refers to a wire layer that rearranges input/output signals from input/output pads of a silicon die (corresponding to semiconductor chip 14 in FIG. 1) to respective input/output terminals of a package (corresponding to semiconductor device 50 in FIG. 1). Metal films 28*b* are provided on the upper surfaces of wires 20. Metal film 28*b* is, for example, a gold film, and is a film for improving solder wettability. When wire 20 is a gold layer, metal film 28*b* may not be provided.

A plurality of electronic components 26 to be connected to wires 20 are mounted on electrically insulating layer 18. Electronic component 26 is, for example, a surface mounted device (SMD), and is a discrete component such as a chip capacitor, a chip inductor, or a chip resistor. Electronic component 26 may be a semiconductor element. The electronic component may not be provided. An electrode 26*a* of electronic component 26 and wire 20 are bonded to each other with a bonding material 27 interposed therebetween. Bonding material 27 is, for example, a brazing material such as a solder. An electrically insulating layer 24 is provided on electrically insulating layer 18 so as to cover wires 20 and electronic components 26. Electrically insulating layer 24 is, for example, a resin layer such as an epoxy resin. Electrically insulating layer 24 has a thickness of, for example, 100 μm to 500 μm. Electrically insulating layer 24 may not be provided. Another wire may be provided on electrically insulating layer 24, and the another wire may be electrically connected to wire 20 through another through electrode extending through another electrically insulating layer. As described above, a plurality of the rewiring layers may be stacked.

A wire 20*a* of wires 20 electrically connects terminal portion 10*b* to semiconductor chip 14. Each of wires 20*b* electrically connects semiconductor chip 14 to electronic component 26. A wire 20*c* electrically connects electronic component 26 to terminal portion 10*b*. Terminal portion 10*b* is a terminal for supplying a bias voltage or a high-frequency signal to semiconductor chip 14. Wire 20 through which a high-frequency signal is transmitted functions as a signal line, and the signal line and base portion 10*a* form a microstrip line. This prevents high-frequency characteristics from deteriorating.

Figure 2:
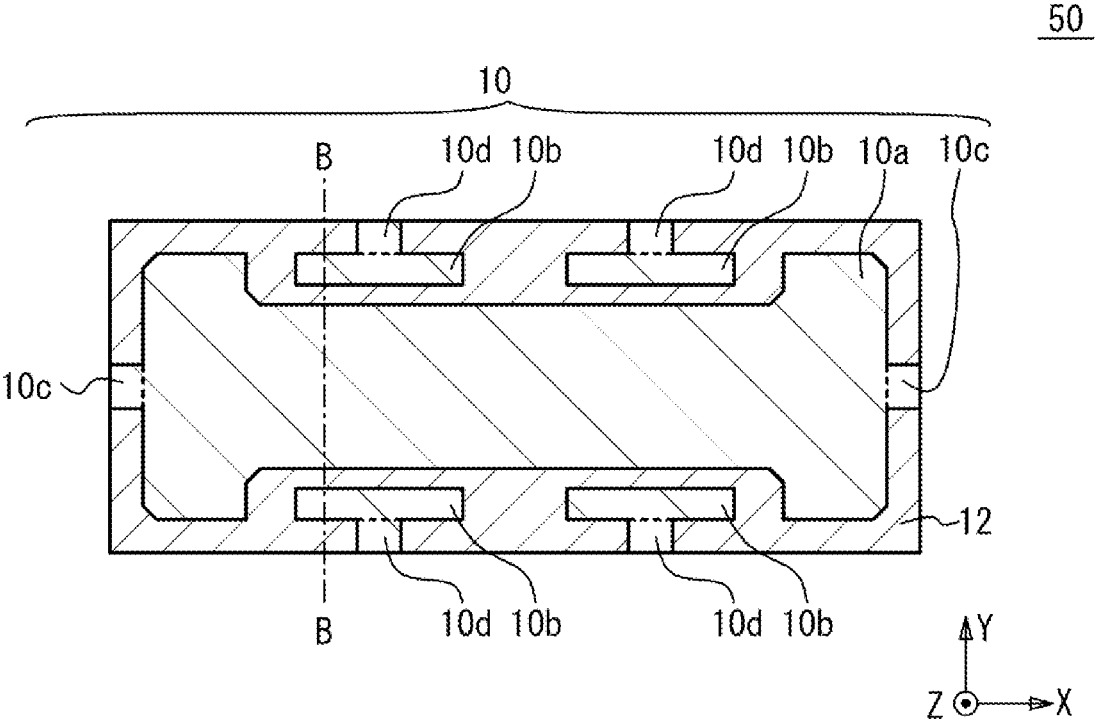
FIG. 2 is a cross-sectional view of the semiconductor device in a planar direction according to the first embodiment, and is a cross-sectional view taken along line A-A in FIG. 1.

FIG. 2 is a cross-sectional view of the semiconductor device in the planar direction according to the first embodiment, and illustrates the cross-section taken along line A-A in FIG. 1 in detail in the planar direction. In FIG. 2, a normal direction of the upper surface of metal plate 10 is a Z direction, and, among the planar directions of the semiconductor device, a long-side direction and a short-side direction are an X direction, and a Y direction, respectively. FIG. 1 corresponds to a cross section taken in the Z direction along line B-B in FIG. 2. As illustrated in FIG. 2, metal plate 10 includes base portion 10*a*, terminal portions 10*b*, and connection portions 10*c* and 10*d*. Base portion 10*a* and terminal portions 10*b* are separated from each other. Two terminal portions 10*b* are provided on a positive side of base portion 10*a* in the Y direction, and another two terminal portions 10*b* are provided on a negative side of base portion 10*a* in the Y direction. The number and arrangement of terminal portions 10*b* can be set as appropriate. Connection portions 10*c* are connected to a positive side and a negative side of base portion 10*a* in the X direction. Connection portions 10*d* are connected to positive sides of terminal portions 10*b* provided on the positive side of base portion 10*a* in the Y direction, respectively, and another connection portions 10*d* are connected to negative sides of terminal portions 10*b* provided on the negative side of base portion 10*a* in the Y direction, respectively.

Figure 3:
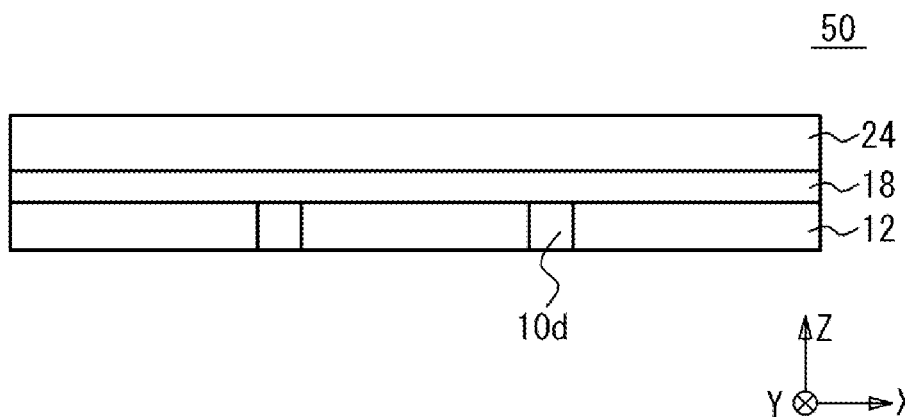
FIG. 3 is a side view of a semiconductor device according to the first embodiment when viewed in a Y direction.
Figure 4:
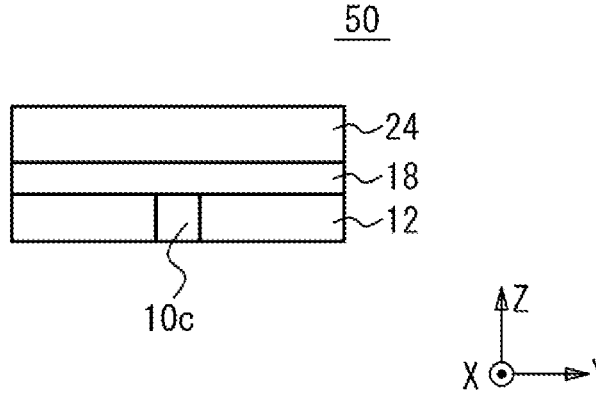
FIG. 4 is a side view of a semiconductor device according to the first embodiment when viewed in an X direction.
Figure 5:
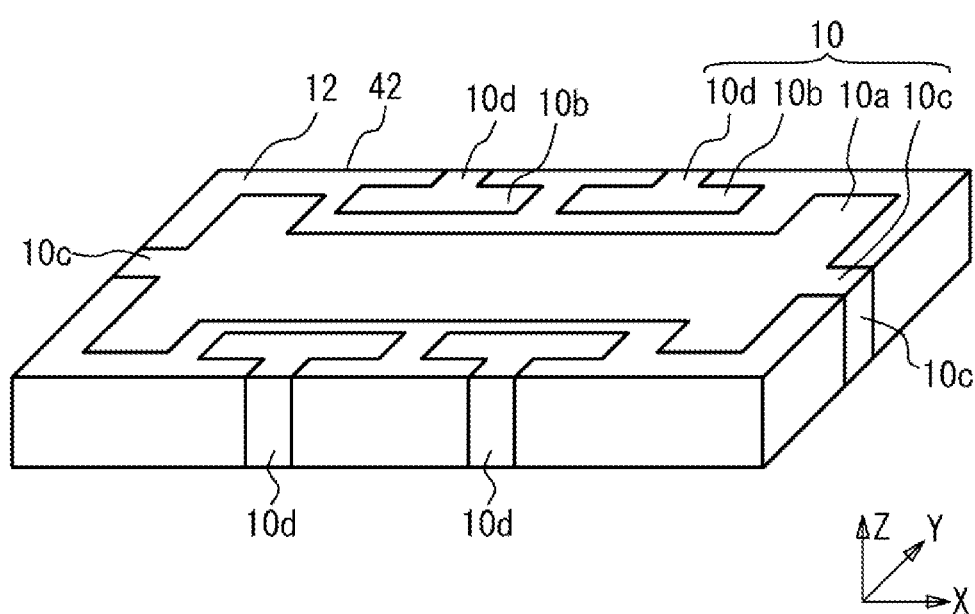
FIG. 5 is a perspective view of a metal layer and a resin layer extracted from a semiconductor device according to the first embodiment.

FIG. 3 is a side view of the side surface of semiconductor device 50 according to the first embodiment when viewed from the outside in the Y direction. FIG. 4 is a side view of the side surface of semiconductor device 50 according to the first embodiment when viewed from the outside in the X direction. FIG. 5 is a perspective view of metal plate 10 and resin layer 12 extracted from semiconductor device 50 according to the first embodiment. As illustrated in FIGS. 3 and 4, electrically insulating layer 18 is provided on resin layer 12, and electrically insulating layer 24 is provided on electrically insulating layer 18. As illustrated in FIGS. 3 and 5, when semiconductor device 50 is viewed from the outside in the Y direction, connection portions 10*d* are exposed from resin layer 12. As illustrated in FIGS. 4 and 5, when semiconductor device 50 is viewed from the outside in the X direction, connection portions 10*c* are exposed from resin layer 12.

[Manufacturing Method in First Embodiment]

Figure 6:
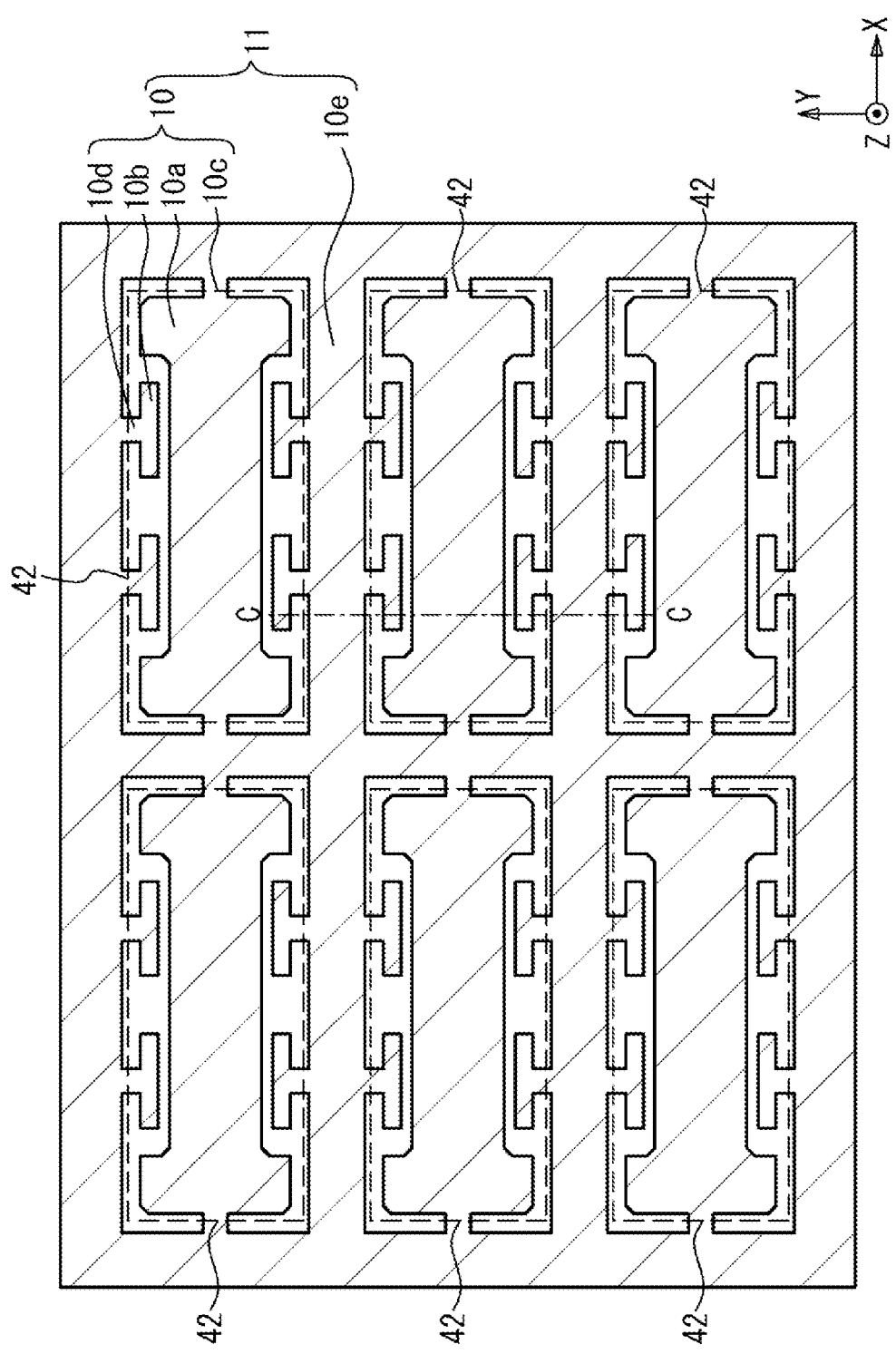
FIG. 6 is a plan view illustrating a method of manufacturing a semiconductor device according to the first embodiment.
Figure 7:
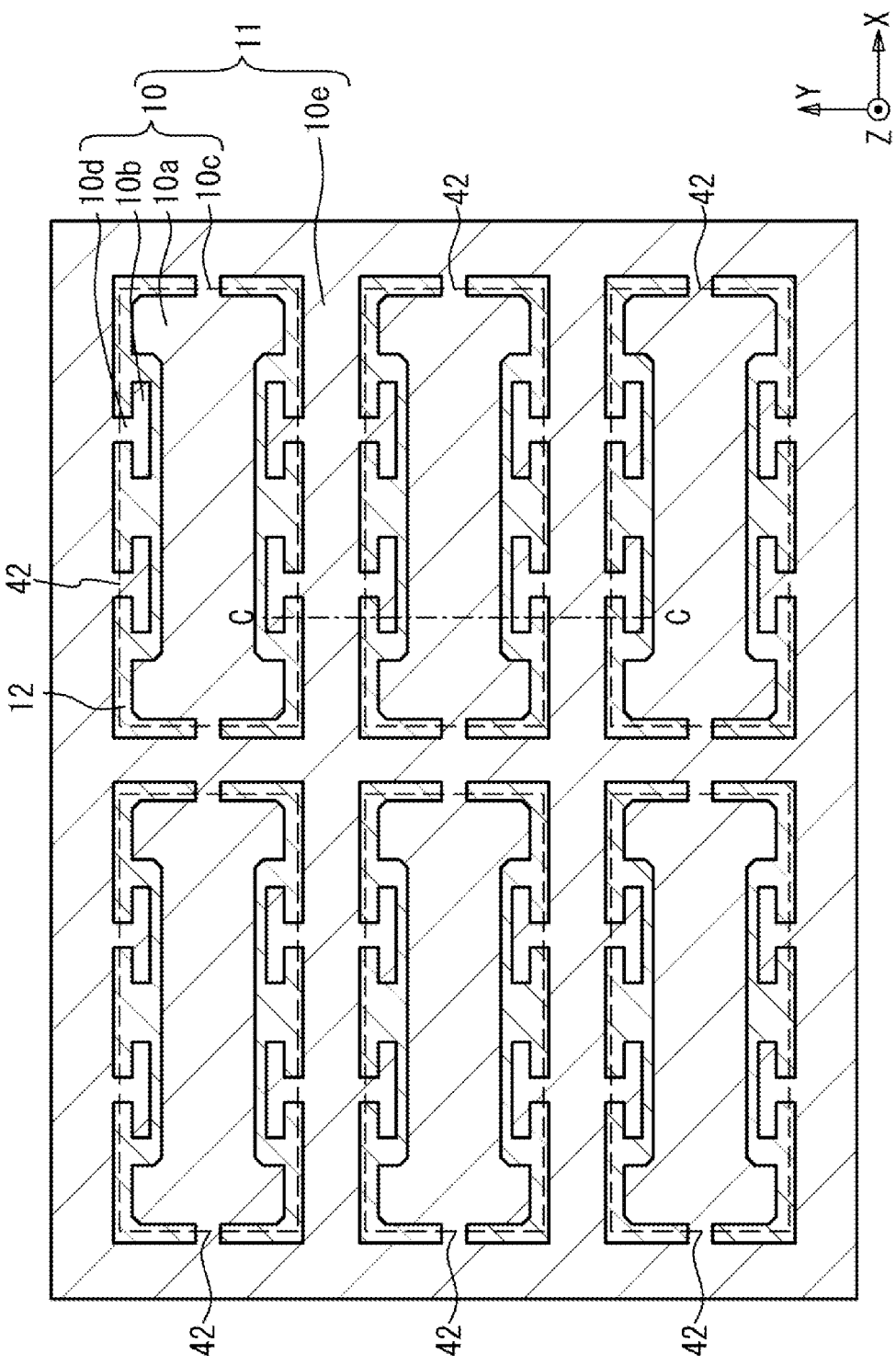
FIG. 7 is a plan view illustrating a method of manufacturing a semiconductor device according to the first embodiment.
Figure 8:
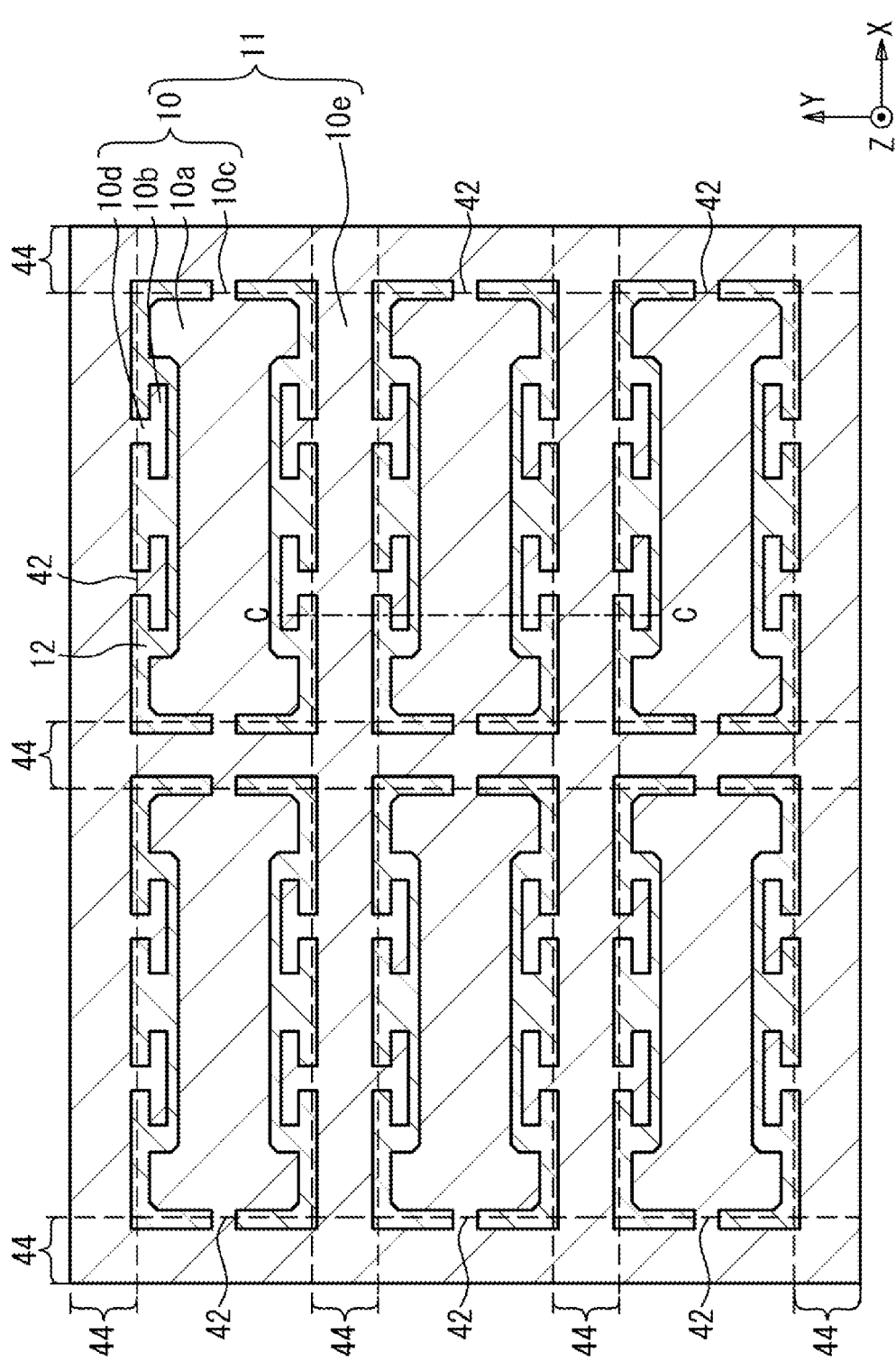
FIG. 8 is a plan view illustrating a method of manufacturing a semiconductor device according to the first embodiment.

FIGS. 6 to 8 are plan views illustrating a method of manufacturing a semiconductor device according to the first embodiment. FIG. 9A to FIG. 11D are cross-sectional views of a method of manufacturing a semiconductor device according to the first embodiment. FIGS. 6 to 8 are plan views of a rectangular substrate and illustrate a plurality of regions 42 in which a plurality of semiconductor devices 50 is to be formed. FIGS. 9A to 11D illustrate one region 42, in which one semiconductor device 50 is to be formed, of the plurality of regions 42 and the vicinity of terminal portions 10*b* of the adjacent regions 42. Note that the cross-sectional view and the plan view are schematic views and do not necessarily coincide with each other.

As illustrated in FIG. 6, a lead frame 11 is prepared. Lead frame 11 includes a plurality of metal plate 10 each constituting semiconductor device 50 illustrated in FIG. 2 and a frame-like connection portion 10*e* connecting metal plates 10 to each other. In lead frame 11, the plurality of regions 42 in which a plurality of semiconductor devices 50 are formed are arranged in a matrix form. Connection portion 10*e* is provided in a lattice shape so as to surround regions 42. In each of regions 42, metal plate 10 including base portion 10*a*, terminal portions 10*b*, and connection portions 10*c* and 10*d* is provided. Metal plate 10 and connection portion 10*e* are connected to each other by connection portions 10*c* and 10*d*. Connection portions 10*c* to 10*e* are so-called suspension leads, and the plurality of metal plates 10 are integrally maintained as lead frame 11 by connection portions 10*c* to 10*e*. Base portion 10*a*, terminal portions 10*b*, and connection portions 10c, 10d, and 10e are formed by hollowing out a single metal plate. Thus, base portion 10a, terminal portions 10b, and connection portions 10c, 10d, and 10e are formed of the same material and have a substantially the same thickness. The length of one side of the plane in each of regions 42 is, for example, 1 mm to 50 mm, and is, as one example, 7 mm×15 mm. The thickness of lead frame 11 is, for example, 0.1 mm to 5 mm, and is 1 mm as an example.

Figure 9A:
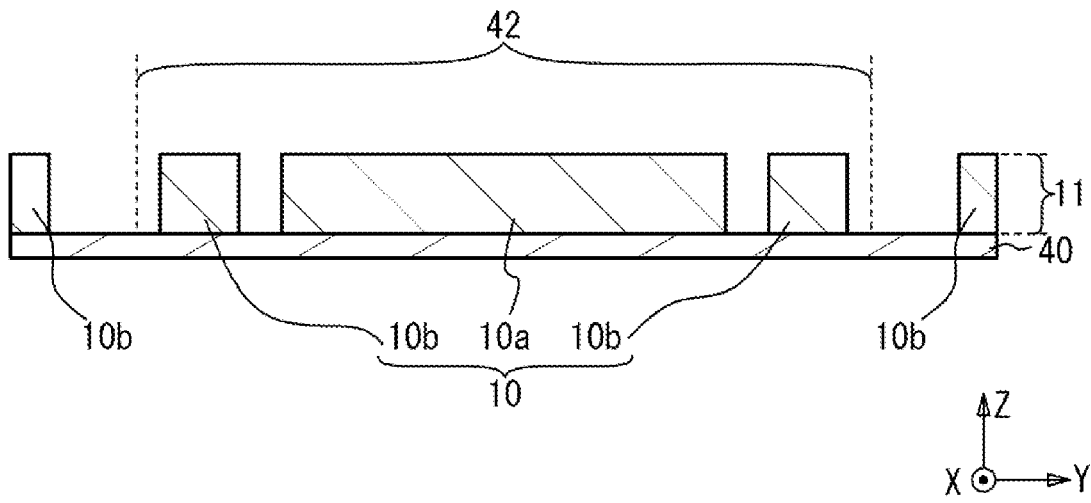
FIG. 9A is a cross-sectional view illustrating a method of manufacturing a semiconductor device according to the first embodiment.
Figure 9B:
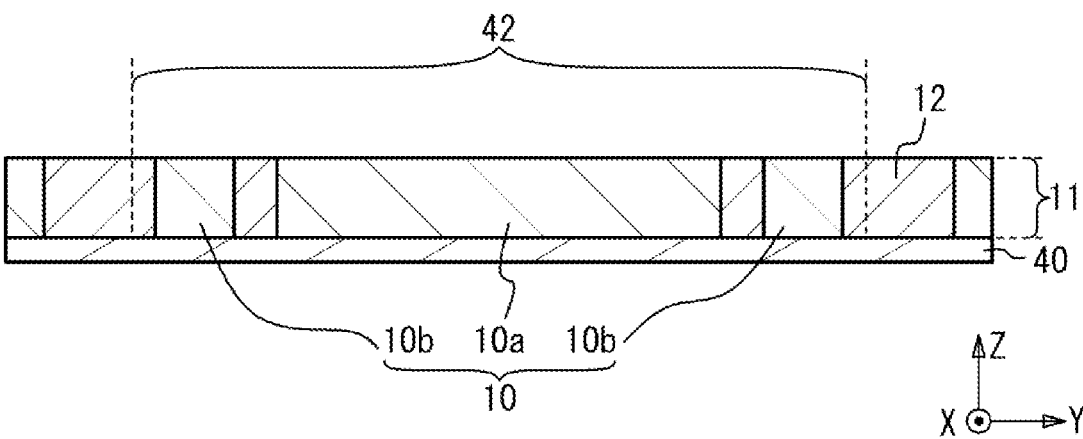
FIG. 9B is a cross-sectional view illustrating a method of manufacturing a semiconductor device according to the first embodiment.

FIG. 9A is a cross-sectional view taken along line C-C in FIG. 6 when viewed in the X direction. As illustrated in FIG. 9A, lead frame 11 is attached to a film 40. Film 40 is made of resin, for example, and protects the lower surface of lead frame 11. FIG. 9B is a cross-sectional view taken along line C-C in FIG. 7 when viewed in the X direction. As illustrated in FIGS. 7 and 9B, resin layer 12 is formed in a space among base portion 10a, terminal portions 10b, and connection portions 10c, 10d, and 10e in lead frame 11. Resin layer 12 is formed by, for example, a molding method or a potting method. The upper and lower surfaces of lead frame 11 are exposed from resin layer 12.

Figure 9C:
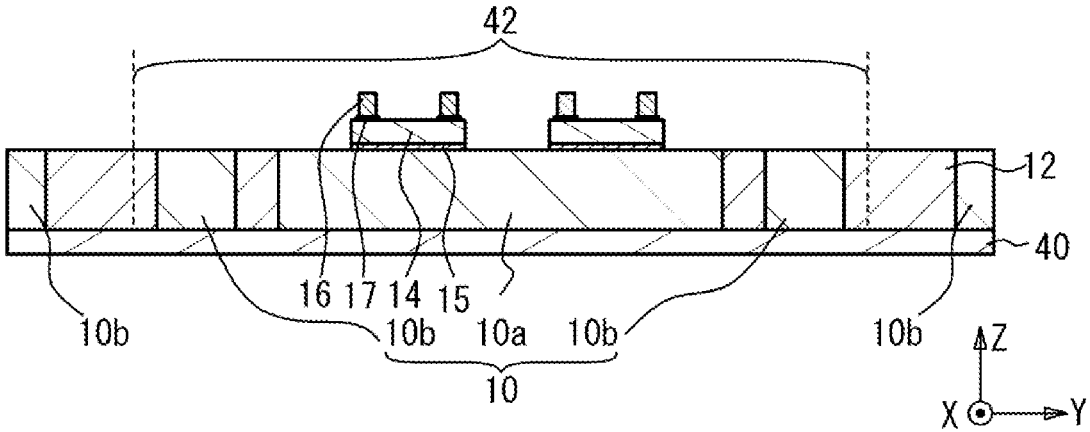
FIG. 9C is a cross-sectional view illustrating a method of manufacturing a semiconductor device according to the first embodiment.
Figure 9D:
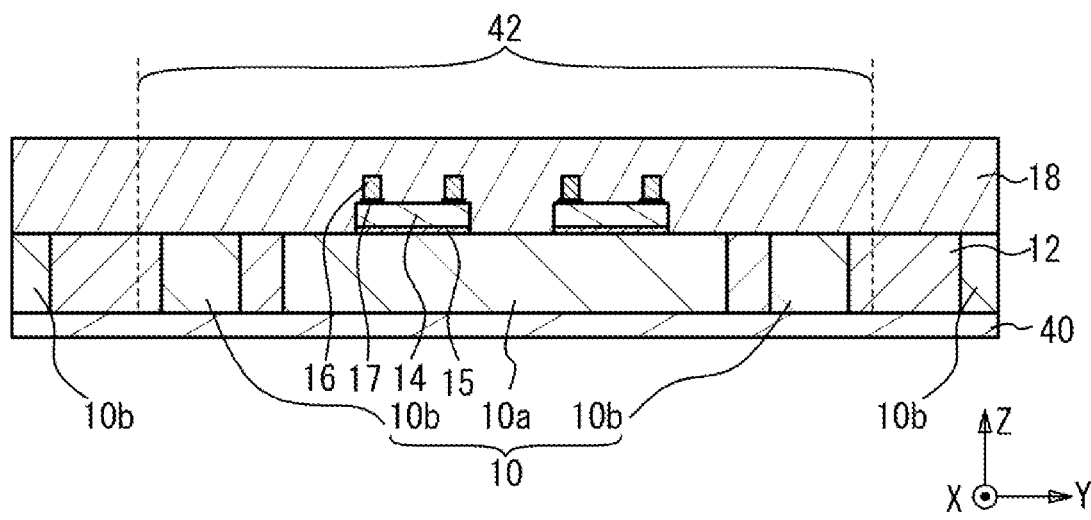
FIG. 9D is a cross-sectional view illustrating a method of manufacturing a semiconductor device according to the first embodiment.

As illustrated in FIG. 9C, subsequent to FIG. 9B, semiconductor chips 14 having metal pillars 16 formed on the upper surface of semiconductor chip 14 are mounted on base portion 10a. Bonding material 15, which is a metal paste such as a nano silver paste, is partially applied on base portion 10a. Thereafter, semiconductor chips 14 are mounted on bonding material 15 and subjected to heat treatment. Bonding material 15 is sintered by the heat treatment. As a result, semiconductor chips 14 are mounted on base portion 10a. As illustrated in FIG. 9D, following FIG. 9C, electrically insulating layer 18 is formed on lead frame 11 and resin layer 12 so as to cover semiconductor chips 14. For example, a resin film is attached onto lead frame 11 and resin layer 12 using a vacuum laminator, and is subjected to heat treatment to cure electrically insulating layer 18. Thus, electrically insulating layer 18 is formed. Electrically insulating layer 18 may be formed by applying a softened resin on lead frame 11 and resin layer 12 and curing the resin by heat treatment, as in a molding method.

Figure 10A:
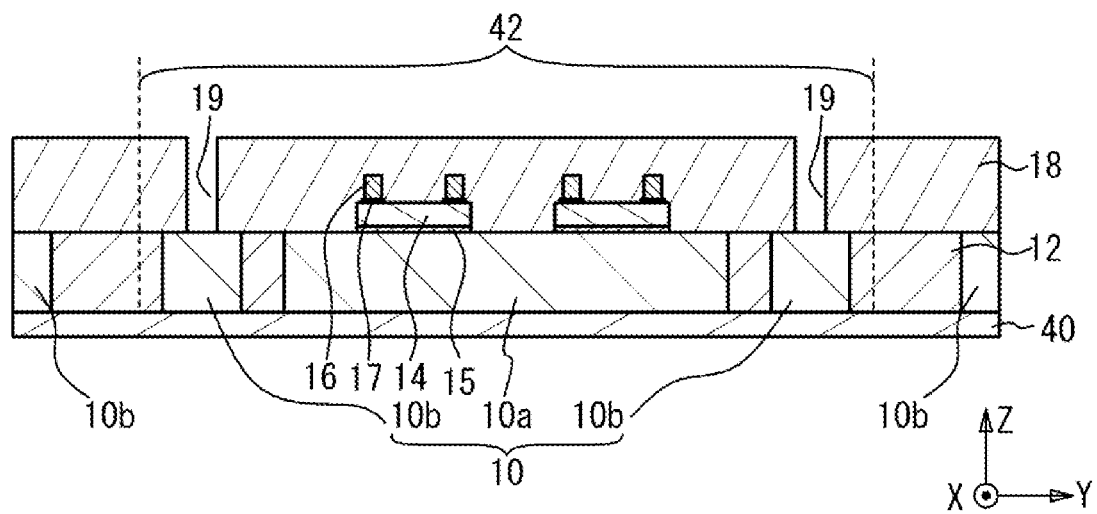
FIG. 10A is a cross-sectional view illustrating a method of manufacturing a semiconductor device according to the first embodiment.
Figure 10B:
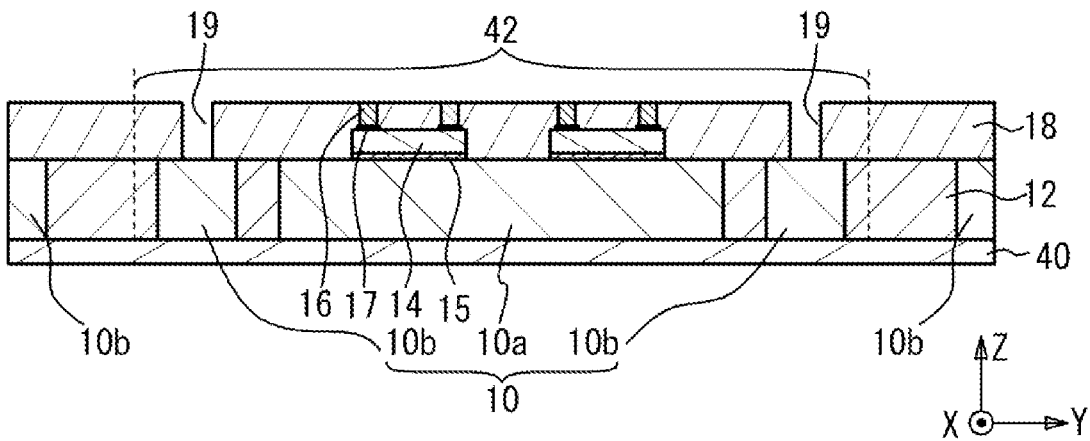
FIG. 10B is a cross-sectional view illustrating a method of manufacturing a semiconductor device according to the first embodiment.
Figure 10C:
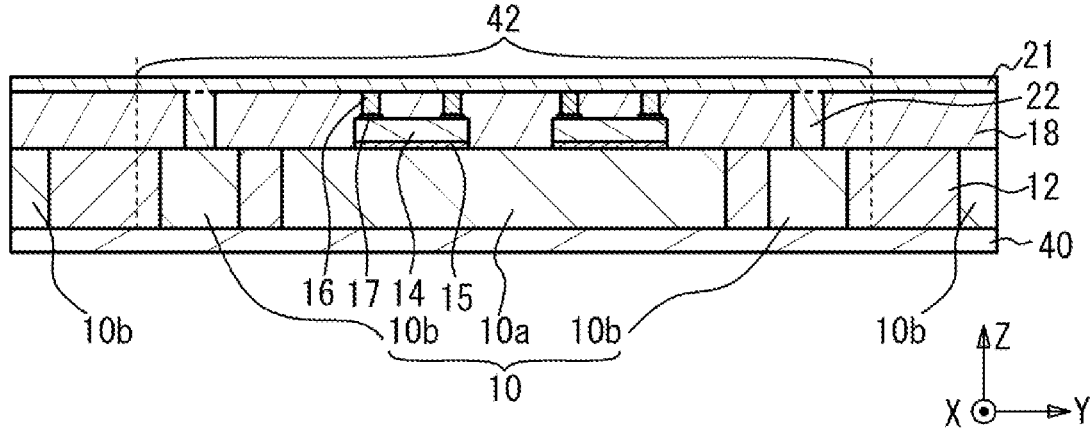
FIG. 10C is a cross-sectional view illustrating a method of manufacturing a semiconductor device according to the first embodiment.
Figure 10D:
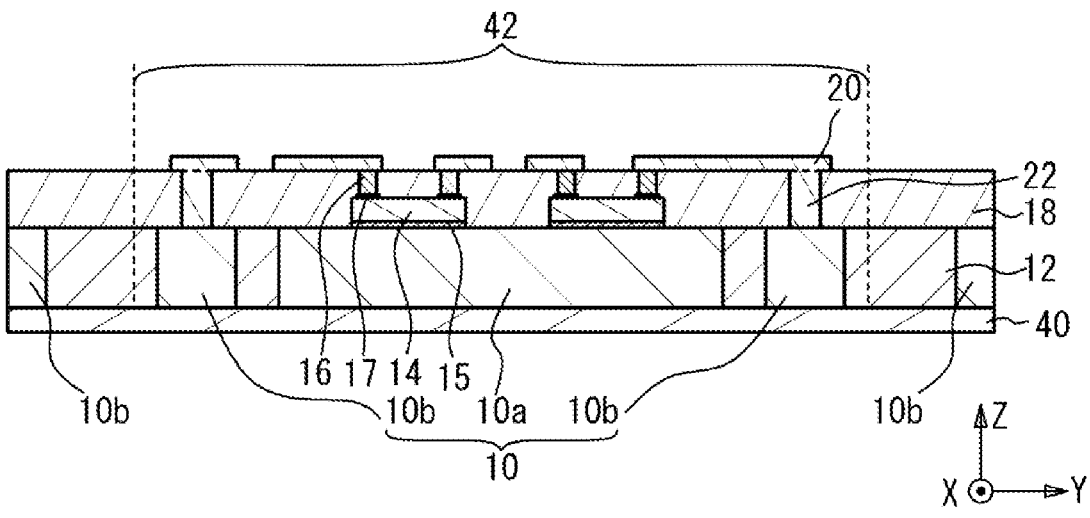
FIG. 10D is a cross-sectional view illustrating a method of manufacturing a semiconductor device according to the first embodiment.

As illustrated in FIG. 10A, following FIG. 9D, through holes 19 are formed which extend through electrically insulating layer 18. Through holes 19 are formed by, for example, irradiating electrically insulating layer 18 with laser light. The upper surface of terminal portion 10b is exposed in through holes 19. As illustrated in FIG. 10B, following FIG. 10A, the upper surface of electrically insulating layer 18 is ground. As a result, the upper surfaces of metal pillars 16 are exposed from the upper surface of electrically insulating layer 18. The upper surface of electrically insulating layer 18 is substantially flush with the upper surfaces of metal pillars 16. As illustrated in FIG. 10C, following FIG. 10B, a metal layer 21 is formed on electrically insulating layer 18 and in through holes 19. Metal layer 21 is formed by plating, for example. Metal layer 21 in through holes 19 becomes through electrodes 22. As illustrated in FIG. 10D, following FIG. 10C, desired regions of metal layer 21 are removed using, for example, an etching method to form wires 20.

Figure 11A:
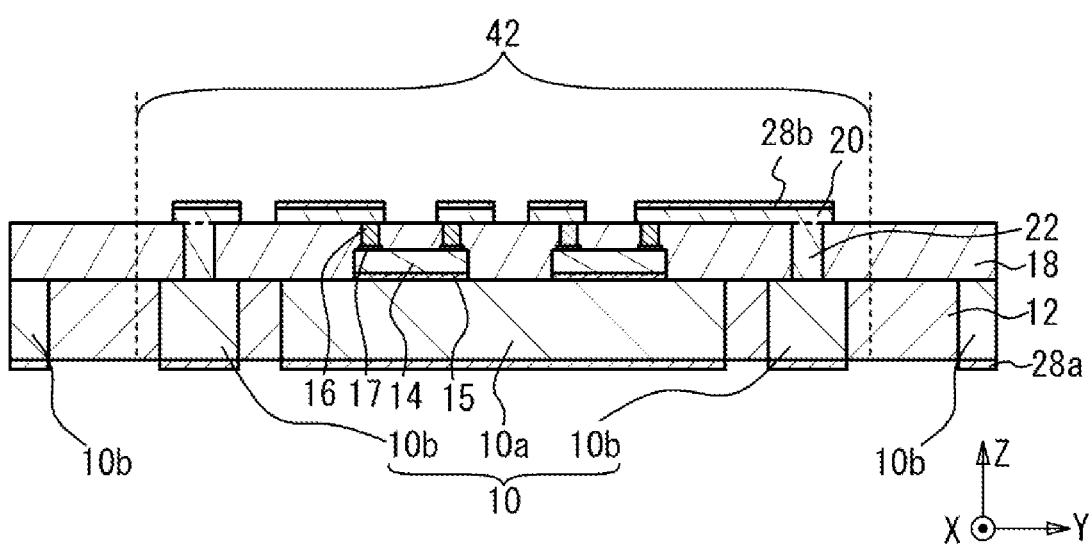
FIG. 11A is a cross-sectional view illustrating a method of manufacturing a semiconductor device according to the first embodiment.
Figure 11B:
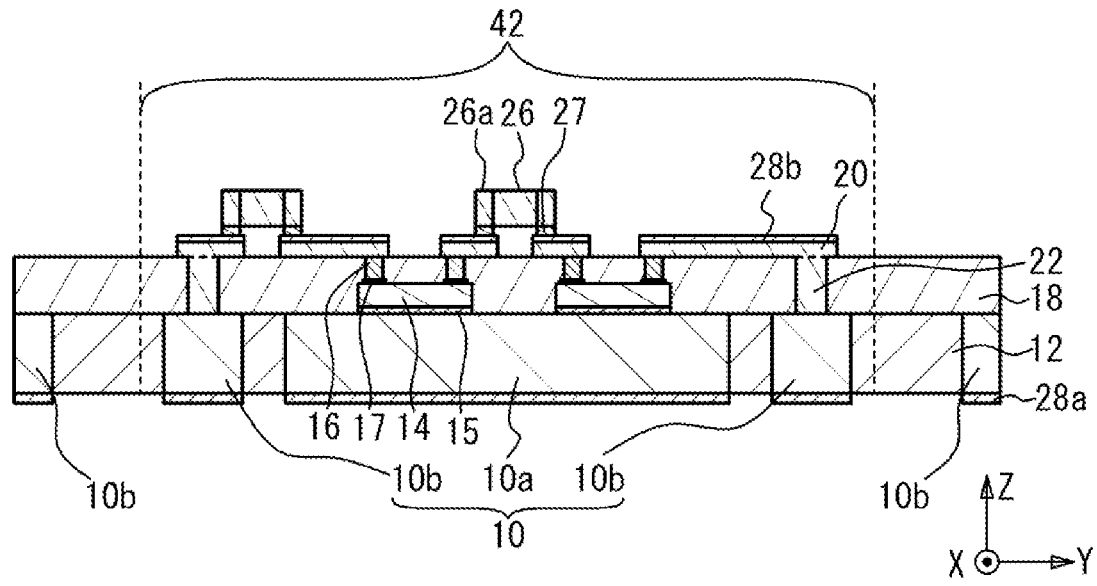
FIG. 11B is a cross-sectional view illustrating a method of manufacturing a semiconductor device according to the first embodiment.
Figure 11C:
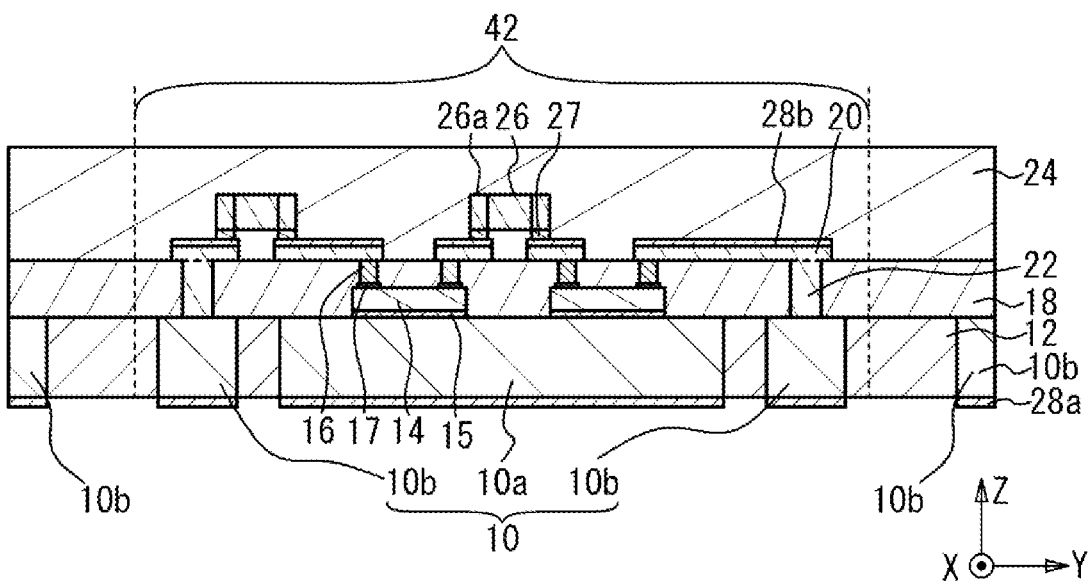
FIG. 11C is a cross-sectional view illustrating a method of manufacturing a semiconductor device according to the first embodiment.

As illustrated in FIG. 11A, following FIG. 10D, film 40 is peeled off from lead frame 11 and resin layer 12. Metal films 28a and 28b are formed on the lower surface of lead frame 11 and the upper surface of wire 20, respectively. Metal films 28a and 28b are formed by plating, for example. As illustrated in FIG. 11B, following FIG. 11A, electronic components 26 are mounted on metal films 28b using bonding material 27. Bonding material 27 bonds electrodes 26a of electronic components 26 to metal films 28b. As illustrated in FIG. 11C, following FIG. 11B, electrically insulating layer 24 is formed on electrically insulating layer 18 so as to cover wires 20 and electronic components 26. Electrically insulating layer 24 is formed by, for example, a molding method or a laminating method.

Figure 11D:
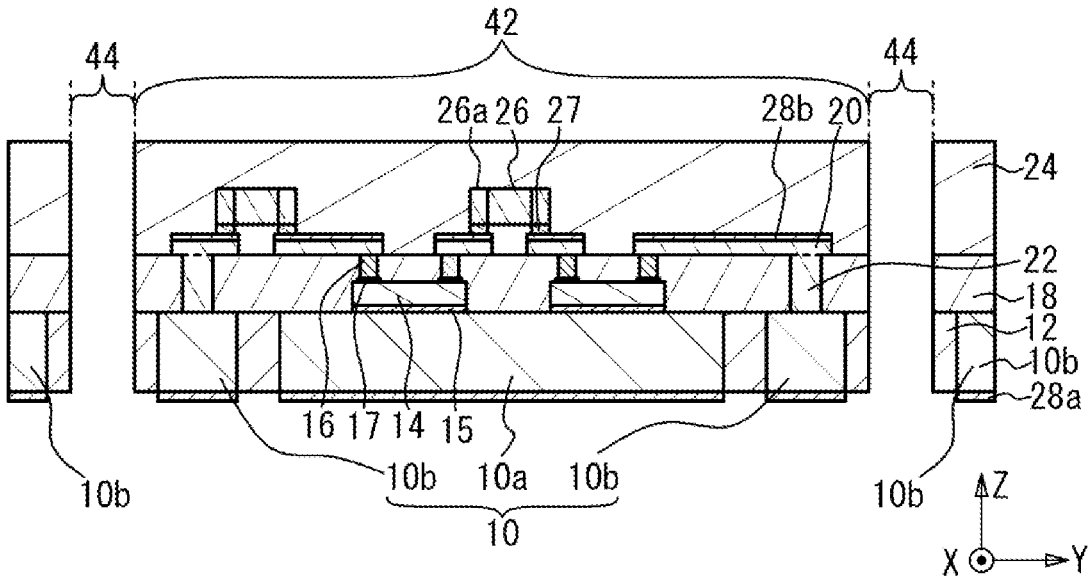
FIG. 11D is a cross-sectional view illustrating a method of manufacturing a semiconductor device according to the first embodiment.

FIG. 11D is a cross-sectional view taken along line C-C in FIG. 8 when viewed in the X direction. As illustrated in FIGS. 11D and 8, following FIG. 11C, electrically insulating layers 24 and 18, resin layer 12, and connection portion 10e are cut in cut regions 44. For the cutting, for example, a dicing method using a dicing blade is used. As a result, connection portion 10e is removed, and base portion 10a and terminal portions 10b are separated from each other in each of regions 42. As described above, individual chips are obtained as semiconductor devices 50. As illustrated in FIGS. 3 and 4, connection portions 10c and 10d are exposed from resin layer 12 on the side surfaces of semiconductor device 50.

Figure 12:
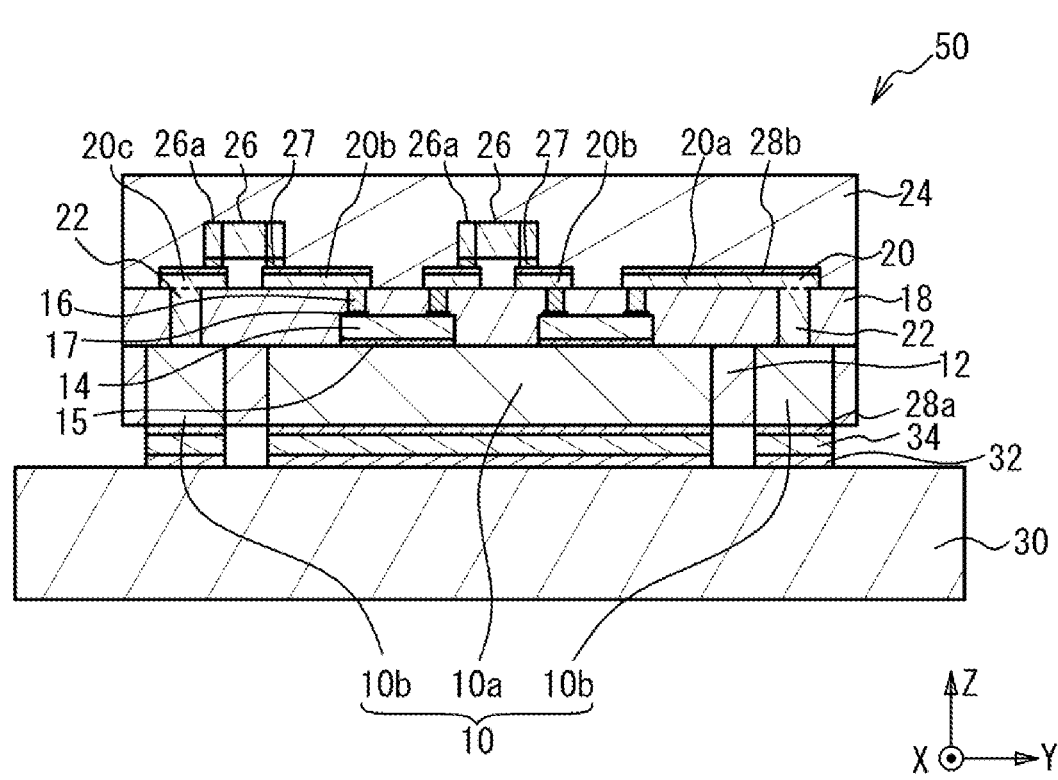
FIG. 12 is a cross-sectional view of a mounted semiconductor device according to the first embodiment.

FIG. 12 is a cross-sectional view of a mounted semiconductor device 50 according to the first embodiment. As illustrated in FIG. 12, metal layers 32 are provided on a mount substrate 30 such as a printed circuit board. Metal layers 32 and metal films 28a of semiconductor device 50 are bonded to each other with solder layers 34 interposed therebetween. Since metal films 28a have good solder wettability, solder layers 34 are firmly bonded to metal films 28a. [Example of High-Frequency Device]

Figure 13:
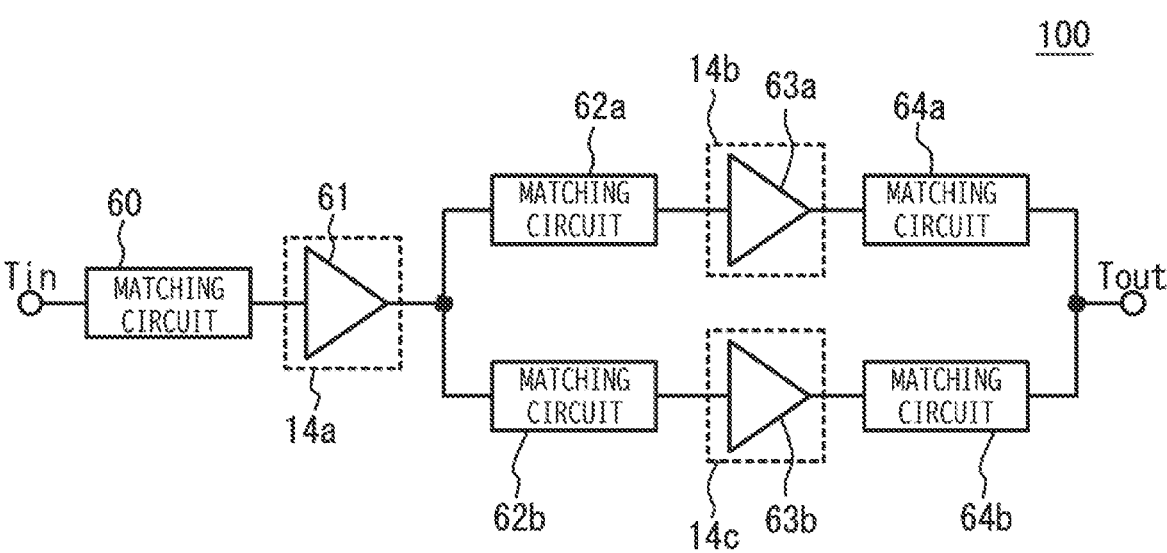
FIG. 13 is a block diagram illustrating a high-frequency device as an example of a semiconductor device according to the first embodiment.

As an example of a high-frequency device mounted on semiconductor device 50, a high-frequency power amplifier used in a base station of mobile communication will be described. FIG. 13 is a block diagram illustrating a high-frequency device as an example of the semiconductor device according to the first embodiment. As illustrated in FIG. 13, a high-frequency device 100 includes amplifiers 61, 63a and 63b and matching circuits 60, 62a, 62b, 64a and 64b. High-frequency device 100 is a two stage Doherty amplifier. A high-frequency signal input from an input terminal Tin is amplified by amplifier 61, further amplified by amplifiers 63a and 63b, and output from an output terminal Tout. Amplifiers 61, 63a, and 63b are, for example, transistors such as FETs, and are mounted on semiconductor chips 14a to 14c, respectively.

Input terminal Tin is connected to amplifier 61 via matching circuit 60. Matching circuit 60 matches an input impedance of input terminal Tin with an input impedance of amplifier 61. An output of amplifier 61 is branched and connected to amplifiers 63a and 63b via matching circuits 62a and 62b, respectively. Matching circuit 62a matches an output impedance of amplifier 61 with an input impedance of amplifier 63a. Matching circuit 62b matches the output impedance of amplifier 61 with an input impedance of amplifier 63b. Outputs of amplifiers 63a and 63b are combined via matching circuits 64a and 64b, respectively, and connected to output terminal Tout. Matching circuit 64a matches an output impedance of amplifier 63a with an output impedance of output terminal Tout. Matching circuit 64b matches an output impedance of amplifier 63b with the output impedance of output terminal Tout. The high-frequency signal input to input terminal Tin and output from output terminal Tout is, for example, a signal of 0.5 GHz to 100 GHz, and is typically a signal of 0.5 GHz to 10 GHz.

Semiconductor chips 14 in FIG. 1 are semiconductor chips 14a to 14c in FIG. 13, and electronic components 26 of FIG. 1 are capacitors, inductors, and resistors included in matching circuits 60, 62a, 62b, 64a, and 64b in FIG. 13.

Figure 14:
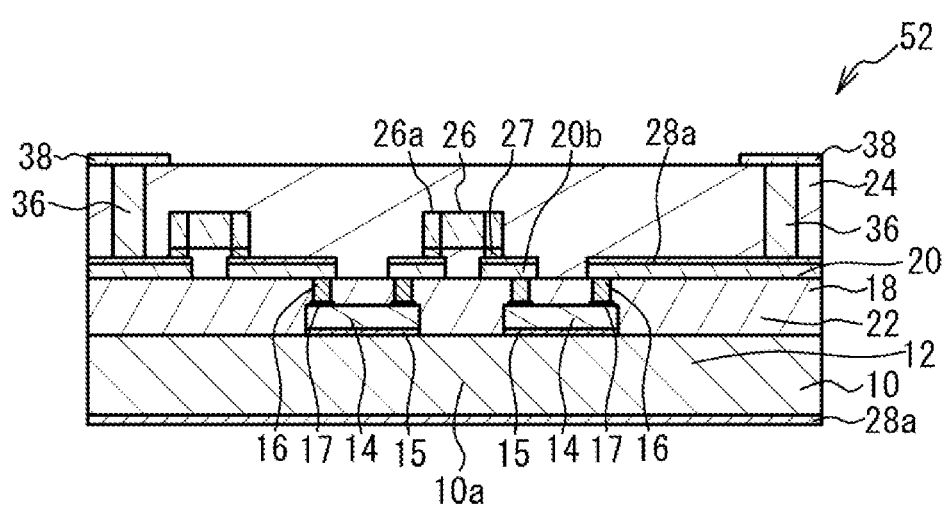
FIG. 14 is a cross-sectional view of a semiconductor device according to a Comparative Example 1.

FIG. 14 is a cross-sectional view of a semiconductor device 52 according to Comparative Example 1. FIG. 14 corresponds to the cross-sectional view of semiconductor device 50 illustrated in FIG. 1 of the first embodiment. As illustrated in FIG. 14, in semiconductor device 52 of Comparative Example 1, metal plate 10 functions as base portion 10*a*, and terminal portions 10*b* are not provided. Through electrodes 36 are provided which extend through electrically insulating layer 24. In Comparative Example 1, heat dissipation can be improved by using base portion 10*a* as a heat sink. By using wires 20 as a signal line and forming a microstrip line with the signal line and base portion 10*a*, high-frequency characteristics can be improved as compared with a case where a bonding wire is used as in PTL 1. Since semiconductor chip 14 and electronic component 26 can be freely arranged, a degree of freedom of mounting is improved. However, through electrodes 36 which extend through electrically insulating layer 24 in a vertical direction and terminals 38 which are connected, on electrically insulating layer 24, to through electrodes 36 reaching the surface of electrically insulating layer 24 are provided. Connection to a mount substrate for supply of a ground potential and heat dissipation is performed at the lower surface of semiconductor device 52, i.e., the lower surface of base portion 10*a*, and electrical connection such as signal and bias voltage to semiconductor device 52 is performed at the upper surface of semiconductor device 52, i.e., terminals 38 on the upper surface of semiconductor device 52.

On the other hand, in semiconductor device 50 according to the first embodiment, when viewed in the planar direction as illustrated in FIG. 2, resin layer 12 is provided between base portion 10*a* and terminal portions 10*b* of metal plate 10 and so as to surround base portion 10*a* except for connection portions 10*c*. As illustrated in FIG. 12, when viewed in a vertical cross-section, the upper and lower surfaces of each of base portion 10*a* and terminal portions 10*b* of metal plate 10 are exposed from resin layer 12. Semiconductor chips 14 are mounted on base portion 10*a* with bonding material 15 interposed therebetween. Electrically insulating layer 18 (first electrically insulating layer) is provided on metal plate 10 and resin layer 12 so as to cover semiconductor chips 14. One or more wires 20 are provided on electrically insulating layer 18, and at least one wire 20*a* electrically connects semiconductor chip 14 to terminal portion 10*b*. As in Comparative Example 1, this improves heat dissipation, high-frequency characteristics, and the degree of freedom in the arrangement of components. In addition, as illustrated in FIG. 12, by mounting semiconductor device 50 on mount substrate 30, base portion 10*a* and terminal portions 10*b* can be bonded to mount substrate 30. Furthermore, the semiconductor device can be manufactured at a lower cost as compared with a case where the semiconductor chip is mounted on each package as in the PTL 1.

In addition, in a case where there is a gap between base portion 10*a* and terminal portions 10*b*, when electrically insulating layer 18 is formed on metal plate 10, a part of electrically insulating layer 18 may penetrate into the gap between base portion 10*a* and terminal portions 10*b*, and the upper surface of electrically insulating layer 18 may be recessed. Furthermore, a foreign material may penetrate into the gap between base portion 10*a* and terminal portions 10*b* during the manufacturing process or during the mounting of the product. When the foreign material is electrically conductive, base portion 10*a* and terminal portion 10*b* may be electrically short-circuited. In the first embodiment, resin layer 12 is provided between base portion 10*a* and terminal portions 10*b*. This allows a part of electrically insulating layer 18 to penetrate into the gap between base portion 10*a* and terminal portions 10*b* and prevent the upper surface of electrically insulating layer 18 from being recessed. Furthermore, this prevent the foreign material from penetrating into the gap between base portion 10*a* and terminal portions 10*b*.

In a method of manufacturing such a semiconductor device, as illustrated in FIG. 6, lead frame 11 includes a plurality of regions 42 each including base portion 10*a* and terminal portions 10*b* separated from each other in each region, and connection portions 10*c*, 10*d*, and 10*e* configured to connect adjacent regions 42. Adjacent regions 42 of the plurality of regions 42 are connected to each other. Connection portions 10*c*, 10*d*, and 10*e* connect base portion 10*a* and terminal portion 10*b* in one of adjacent regions 42 with base portion 10*a* and terminal portion 10*b* in another one of the adjacent regions 42. As illustrated in FIG. 7, resin layer 12 is formed among base portion 10*a*, terminal portion 10*b*, and connection portions 10*c* to 10*e* in lead frame 11. As illustrated in FIG. 9C, semiconductor chips 14 are mounted on each base portion 10*a* in the plurality of regions 42. As illustrated in FIG. 9D, electrically insulating layer 18 is formed on lead frame 11 and resin layer 12 so as to cover semiconductor chips 14. As illustrated in FIGS. 10A to 10D, wires 20 electrically connecting semiconductor chips 14 and terminal portions 10*b* to each other are formed on electrically insulating layer 18. As illustrated in FIGS. 8 and 11D, after forming wires 20, the plurality of semiconductor devices 50 corresponding to the plurality of regions 42 are formed by cutting connection portions 10*c*, 10*d*, and 10*e*, and resin layer 12 between adjacent regions 42 along cut regions 44 indicated by dotted lines in the figure. This allows semiconductor devices 50 to be manufactured using lead frame 11 having the plurality of regions 42, thereby reducing the cost of the semiconductor device.

When semiconductor devices 50 are manufactured as described above, metal plate 10 includes connection portions 10*c* (first connection portion) connected to base portion 10*a* and connection portions 10*d* (second connection portion) connected to terminal portions 10*b*. FIG. 5 corresponds to a perspective view of metal plate 10 and resin layer 12 in region 42 in FIGS. 9B to 11C. As illustrated in FIG. 5, base portion 10*a* and terminal portions 10*b* are not exposed from the side surface of resin layer 12, and each of connection portions 10*c* and 10*d* is exposed from the side surface of resin layer 12. This allows the semiconductor devices to be manufactured by using lead frame 11, thereby reducing the cost of the semiconductor device.

When metal plate 10 is used as a heat sink, metal plate 10 becomes thicker. In a case where metal plate 10 is thicker than electrically insulating layer 18, when there is a gap between base portion 10*a* and terminal portion 10*b*, a part of electrically insulating layer 18 can easily penetrate into the gap in FIG. 9D. In addition, a foreign material easily penetrates into the gap. Furthermore, it is difficult to provide base portion 10*a* and terminal portions 10*b* by etching metal plate 10 after semiconductor chips 14 are mounted on metal plate 10. Thus, the semiconductor device is preferably manufactured by the above method. The thickness of metal plate 10 is preferably 1.5 times or more, and more preferably 2 times or more the thickness of electrically insulating layer 18.

As in FIG. 1, electronic components 26 are mounted on electrically insulating layer 18 and is connected to at least one of wires 20*b* and 20*c* which are the one or more wires 20. This allows electronic components 26 connected to semiconductor chips 14 and terminal portions 10*b* to be provided.

Metal pillars 16 are provided on the upper surface of semiconductors chip 14, extend through electrically insulating layer 18, and connect semiconductor chips 14 to at least one of wires 20*a* and 20*b* which are the one or more wires 20. Thus, semiconductor chips 14 can be electrically connected to at least one of wires 20*a* and 20*b*.

Further, terminal portion 10*b* and at least one of wires 20*a* and 20*c* which are the one or more wires 20 are connected via through electrode 22 extending through electrically insulating layer 18. As a result, at least one of wires 20*a* and 20*b* can be electrically connected to terminal portion 10*b*.

Further, electrically insulating layer 24 (second electrically insulating layer) is provided on electrically insulating layer 18 so as to cover wires 20. This allows wires 20 and electronic components 26 to be sealed.

It should be understood that the embodiment disclosed herein are illustrative and non-restrictive in all aspects. The scope of the present invention is defined by the scope of the claims, not in the sense described above, and it is intended to embrace all modifications within the meaning and scope equivalent to the scope of the claims.

What is claimed is:

1. A semiconductor device comprising:
a metal plate including a base portion and a terminal portion separated from the base portion;
a resin layer provided between the base portion and the terminal portion and surrounding the metal plate in a planar direction, and wherein an upper surface and a lower surface of each of the base portion and the terminal portion are exposed;
a semiconductor chip mounted on the base portion;
a first electrically insulating layer provided on the metal plate and the resin layer so as to cover the semiconductor chip; and
one or more wires provided on the first electrically insulating layer, the one or more wires including at least one wire configured to electrically connect the semiconductor chip and the terminal portion to each other, wherein:
the first electrically insulating layer covers an upper surface of the resin layer
the metal plate includes a first connection portion connected to the base portion, and a second connection portion connected to the terminal portion, and
the base portion and the terminal portion are not exposed from a side surface of the resin layer, and each of the first connection portion and the second connection portion is exposed from a side surface of the resin layer.

2. The semiconductor device according to claim 1, further comprising:
an electronic component mounted on the first electrically insulating layer and connected to at least one of the one or more wires.

3. The semiconductor device according to claim 1, wherein the metal plate is thicker than the first electrically insulating layer.

4. The semiconductor device according to claim 1, further comprising:
a metal pillar provided at an upper surface of the semiconductor chip and extending through the first electrically insulating layer, the metal pillar being configured to connect the semiconductor chip and at least one of the one or more wires to each other.

5. The semiconductor device according to claim 1, wherein the terminal portion and at least one of the one or more wires are connected to each other via a through electrode extending through the first electrically insulating layer.

6. The semiconductor device according to claim 1, further comprising:
a second electrically insulating layer provided on the first electrically insulating layer so as to cover the one or more wires.

7. The semiconductor device according to claim 1, wherein
the resin layer has a top face that lies flush with the upper surface of the base portion and the upper surface of the terminal portion.

8. The semiconductor device according to claim 7, wherein
the metal plate further includes a first connection portion integrally continuous with the base portion and a second connection portion integrally continuous with the terminal portion,
the base portion and the terminal portion are not exposed from any side surface of the resin layer,
only the first and second connection portions are exposed from a side surface of the resin layer, and
the connection portions being configured to be severed during singulation of the semiconductor device.

9. A method of manufacturing a semiconductor device, the method comprising:
forming a resin layer at a lead frame including a plurality of regions and a connection portion, the plurality of regions each including a base portion and a terminal portion separated from each other in each region, the connection portion being configured to connect the base portion and the terminal portion in one of adjacent regions of the plurality of regions with the base portion and the terminal portion in another one of the adjacent regions, the resin layer being formed among the base portion, the terminal portion, and the connection portion;
mounting a semiconductor chip on each base portion in the plurality of regions;
forming an electrically insulating layer on the lead frame and the resin layer covering the semiconductor chip;
forming, on the electrically insulating layer, a wire configured to electrically connect the semiconductor chip and the terminal portion to each other; and
forming, after forming the wire, a plurality of the semiconductor devices corresponding to the plurality of regions by cutting the connection portion and the resin layer between the adjacent regions,
wherein:
the first electrically insulating layer covers an upper surface of the resin layer
the metal plate includes a first connection portion connected to the base portion, and a second connection portion connected to the terminal portion, and
the base portion and the terminal portion are not exposed from a side surface of the resin layer, and each of the first connection portion and the second connection portion is exposed from a side surface of the resin layer.

10. A semiconductor device comprising:
a metal plate including a base portion and a terminal portion separated from the base portion;
a resin layer provided between the base portion and the terminal portion and surrounding the metal plate in a planar direction, and wherein an upper surface and a lower surface of each of the base portion and the terminal portion are exposed;

a semiconductor chip mounted on the base portion;

a first electrically insulating layer provided on the metal plate and the resin layer so as to cover the semicon- ductor chip; and one or more wires provided on the first electrically insulating layer, the one or more wires including at least one wire configured to electrically connect the semiconductor chip and the terminal portion to each other, wherein:

the first electrically insulating layer covers an upper surface of the resin layer, the resin layer has a top face that lies flush with the upper surface of the base portion and the upper surface of the terminal portion, the metal plate further includes a first connection portion integrally continuous with the base portion and a second connection portion integrally continuous with the terminal portion, the base portion and the terminal portion are not exposed from any side surface of the resin layer, only the first and second connection portions are exposed from a side surface of the resin layer, and the connection portions being configured to be severed during singulation of the semiconductor device.

11. The semiconductor device according to claim 10, wherein the metal plate includes a first connection portion connected to the base portion, and a second connection portion connected to the terminal portion, and wherein the base portion and the terminal portion are not exposed from a side surface of the resin layer, and each of the first connection portion and the second connection portion is exposed from a side surface of the resin layer.

12. A method of manufacturing a semiconductor device, the method comprising:

forming a resin layer at a lead frame including a plurality of regions and a connection portion, the plurality of regions each including a base portion and a terminal portion separated from each other in each region, the connection portion being configured to connect the base portion and the terminal portion in one of adjacent regions of the plurality of regions with the base portion and the terminal portion in another one of the adjacent regions, the resin layer being formed among the base portion, the terminal portion, and the connection portion;

mounting a semiconductor chip on each base portion in the plurality of regions;

forming an electrically insulating layer on the lead frame and the resin layer covering the semiconductor chip;

forming, on the electrically insulating layer, a wire configured to electrically connect the semiconductor chip and the terminal portion to each other; and forming, after forming the wire, a plurality of the semiconductor devices corresponding to the plurality of regions by cutting the connection portion and the resin layer between the adjacent regions, wherein:

the first electrically insulating layer covers an upper surface of the resin layer, the resin layer has a top face that lies flush with the upper surface of the base portion and the upper surface of the terminal portion, the lead frame further includes a first connection portion integrally continuous with the base portion and a second connection portion integrally continuous with the terminal portion, the base portion and the terminal portion are not exposed from any side surface of the resin layer, only the first and second connection portions are exposed from a side surface of the resin layer, and the connection portions being configured to be severed during singulation of the semiconductor device.

* * * * *